US012651539B2

(12) United States Patent
Zhang et al.

(10) Patent No.: US 12,651,539 B2
(45) Date of Patent: Jun. 9, 2026

(54) DISPLAY PANEL, DISPLAY PANEL MANUFACTURING METHOD, AND ELECTRONIC DEVICE

(71) Applicant: HUAWEI TECHNOLOGIES CO., LTD., Shenzhen (CN)

(72) Inventors: Shuai Zhang, Shenzhen (CN); Chujung Shih, Shenzhen (CN); Haiming He, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 313 days.

(21) Appl. No.: 18/249,701

(22) PCT Filed: Sep. 28, 2021

(86) PCT No.: PCT/CN2021/121239
§ 371 (c)(1),
(2) Date: Apr. 19, 2023

(87) PCT Pub. No.: WO2022/083430
PCT Pub. Date: Apr. 28, 2022

(65) Prior Publication Data
US 2023/0387132 A1 Nov. 30, 2023

(30) Foreign Application Priority Data

Oct. 20, 2020 (CN) .......................... 202011124372.7

(51) Int. Cl.
*G09F 9/30* (2006.01)
*H10D 86/40* (2025.01)
(Continued)

(52) U.S. Cl.
CPC ........... *G09F 9/301* (2013.01); *H10D 86/421* (2025.01); *H10K 59/1213* (2023.02); *H10K 2102/311* (2023.02)

(58) Field of Classification Search
CPC .. G09F 9/301; H10D 86/421; H10K 59/1213; H10K 2102/311
See application file for complete search history.

(56) References Cited

U.S. PATENT DOCUMENTS

2007/0018170 A1* 1/2007 Jeong ................. H10D 30/6758
257/72

FOREIGN PATENT DOCUMENTS

CN 1901206 A 1/2007
CN 103985637 A 8/2014
(Continued)

*Primary Examiner* — Peter M Albrecht
(74) *Attorney, Agent, or Firm* — Fish & Richardson P.C.

(57) ABSTRACT

Embodiments of this application provide a display panel, a display panel manufacturing method, and an electronic device. The display panel includes a bent display area, the bent display area has a bending shaft, a plurality of first thin film transistors are disposed in the bent display area, each first thin film transistor includes a first source and a first drain, a first conductive channel is formed between the first source and the first drain of each first thin film transistor, and an included angle between a direction of the first conductive channel and the bending shaft is less than 90 degrees; and a total length of each part of the first conductive channel in the direction of the first conductive channel is greater than a total length of each part of the first conductive channel in any other direction. The display panel can reduce a difference between display brightness of the bent display area and display brightness of a non-bent display area.

9 Claims, 7 Drawing Sheets

(51) Int. Cl.
    *H10K 59/121*     (2023.01)
    *H10K 102/00*     (2023.01)

(56)           References Cited

FOREIGN PATENT DOCUMENTS

| CN | 108831308 A | * 11/2018 | ............. G09F 9/301 |
| CN | 110648641 A | 1/2020 | |
| KR | 20160082799 A | * 7/2016 | ............... G09G 3/36 |

* cited by examiner

DISPLAY PANEL, DISPLAY PANEL MANUFACTURING METHOD, AND ELECTRONIC DEVICE

CROSS-REFERENCE TO RELATED APPLICATIONS

This application is a National Stage of International Application No. PCT/CN2021/121239, filed on Sep. 28, 2021, which claims priority to Chinese Patent Application No. 202011124372.7, filed on Oct. 20, 2020. Both of the aforementioned applications are hereby incorporated by reference in their entireties.

TECHNICAL FIELD

This application relates to the field of display technologies, and in particular, to a display panel, a display panel manufacturing method, and an electronic device.

BACKGROUND

A flexible display is a display that can be flexed, bent, folded, or rolled without obvious damage and is made of a thin and flexible substrate, which is different from a flat panel display.

With an increasing quantity of flexible displays, active-matrix organic light-emitting diode (active-matrix organic light-emitting diode, AMOLED) display panels based on low temperature polycrystalline silicon (low temperature p-Si, LTPS) are widely used. However, in a bending process of the LTPS-based flexible display, there is a brightness difference between a bent display area and a non-bent display area. In addition, as a display time of the bent display area increases, a difference between display brightness of the bent display area and display brightness of the non-bent display area becomes larger.

SUMMARY

This application provides a display panel, a display panel manufacturing method, and an electronic device, to reduce a difference between display brightness of a bent display area and that of a non-bent display area.

According to a first aspect, this application provides a display panel, including a bent display area, where the bent display area has a bending axis, a plurality of first thin film transistors are disposed in the bent display area, each first thin film transistor includes a first source and a first drain, a first conductive channel is formed between the first source and the first drain of each first thin film transistor, and an included angle between a direction of the first conductive channel and the bending axis is less than 90 degrees; and a total length of each part of the first conductive channel in the direction of the first conductive channel is greater than a total length of each part of the first conductive channel in any other direction.

In the foregoing display panel, the included angle between the direction of the first conductive channel of the first thin film transistor in the bent display area and the bending axis is set to be less than 90 degrees. Therefore, when the included angle between the direction of the first conductive channel and a strain direction of the first conductive channel is not 0 degrees, as compared with a case in which the direction of the first conductive channel is parallel to the strain direction of the first conductive channel, the strain on the first conductive channel along the direction of the first conductive channel decreases, a change of a carrier mobility in the first conductive channel decreases, a change of a turn-on current of the first thin film transistor decreases, a change of a drive current of the bent display area decreases, and a difference between display brightness of the bent display area and that of the non-bent display area decreases, thereby improving a display effect of the display panel.

In a possible design, when bending of the display panel causes the first thin film transistor to be subjected to a compressive strain, the included angle between the direction of the first conductive channel of the first thin film transistor and the bending axis is 0 degrees to 5 degrees.

In a possible design, the included angle between the direction of the first conductive channel of the first thin film transistor and the bending axis is 0 degrees. According to the solution provided in this embodiment, the compressive strain on the first conductive channel is perpendicular to the direction of the first conductive channel, the length of the first conductive channel in the direction of the first conductive channel does not change with the compressive strain on the first conductive channel, and a carrier mobility in the first conductive channel does not change with the compressive strain on the first conductive channel. Therefore, the turn-on current of the first thin film transistor does not change with the compressive strain on the first conductive channel, the drive current of the bent display area is the same as that of the non-bent display area, and the display brightness of the bent display area is the same as that of the non-bent display area.

In a possible design, when bending of the display panel causes the first thin film transistor to be subjected to a tensile strain, the included angle between the direction of the first conductive channel of the first thin film transistor and the bending axis is 65 degrees to 75 degrees. According to the solution provided in this embodiment, the included angle between the direction of the first conductive channel of the first thin film transistor and the bending axis is set to 65 degrees to 75 degrees, the tensile strain on the first conductive channel is mostly perpendicular to the direction of the first conductive channel, and the length of the first conductive channel in the direction of the first conductive channel changes slightly with the tensile strain on the first conductive channel, a carrier mobility in the first conductive channel changes slightly with the tensile strain on the first conductive channel. Therefore, the turn-on current of the first thin film transistor changes slightly with the tensile strain on the first conductive channel, a difference between the drive current of the bent display area and the drive current of the non-bent display area is relatively small, and a difference between the display brightness of the bent display area and the display brightness of the non-bent display area is relatively small.

In a possible design, a plurality of second thin film transistors are further disposed in the bent display area, each second thin film transistor includes a second source and a second drain, a second conductive channel is formed between the second source and the second drain of each second thin film transistor, and a direction of the second conductive channel is the same as that of the first conductive channel; and a total length of each part of the second conductive channel in the direction of the second conductive channel is greater than a total length of each part of the second conductive channel in any other direction. According to the solution provided in this embodiment, the direction of the second conductive channel of the second thin film transistor in the bent display area is set to be the same as the direction of the first conductive channel, so that a manufacturing process of the thin film transistor of the display panel can be simplified, and costs can be reduced.

In a possible design, both the first thin film transistor and the second thin film transistor are low temperature polycrystalline silicon thin film transistors.

In a possible design, the display panel further includes a non-bent display area, where a plurality of third thin film transistors are disposed in the non-bent display area, each third thin film transistor includes a third source and a third drain, a third conductive channel is formed between the third source and the third drain of each third thin film transistor, and a direction of the third conductive channel is different from the direction of the first conductive channel; and a total length of each part of the third conductive channel in a direction of the third conductive channel is greater than a total length of each part of the third conductive channel in any other direction.

In a possible design, the display panel further includes a non-bent display area, where a plurality of third thin film transistors are disposed in the non-bent display area, each third thin film transistor includes a third source and a third drain, a third conductive channel is formed between the third source and the third drain of each third thin film transistor, and a direction of the third conductive channel is the same as that of the first conductive channel; and a total length of each part of the third conductive channel in a direction of the third conductive channel is greater than a total length of each part of the third conductive channel in any other direction. According to the solution provided in this embodiment, the direction of the third conductive channel of the third thin film transistor in the non-bent display area is set to be the same as the direction of the first conductive channel, so that a manufacturing process of the thin film transistor of the display panel can be simplified, and costs can be reduced.

In a possible design, the third thin film transistor is a low temperature polycrystalline silicon thin film transistor.

According to a second aspect, this application provides an electronic device, including the display panel according to the first aspect.

According to a third aspect, this application provides a display panel manufacturing method, including:

providing a substrate, where the substrate includes a bent display area, and the bent display area has a bending axis;

forming a buffer layer on the substrate;

depositing an amorphous silicon thin film on the buffer layer, performing polycrystallization processing on the amorphous silicon thin film to form a polycrystalline silicon thin film, and performing patterning processing on the polycrystalline silicon thin film to form an active layer located on the buffer layer;

forming a gate insulation layer on the patterned active layer; and forming a first metal layer on the gate insulation layer, and patterning the first metal layer to form a gate located above the active layer; where in a process of forming the gate, ion injection is performed on the active layer, so that the active layer includes a first conductive channel, a first source region, and a first drain region, the first conductive channel is formed between the first source region and the first drain region, and an included angle between a direction of the first conductive channel and the bending axis is less than 90 degrees, and a total length of each part of the first conductive channel in a direction of the first conductive channel is greater than a total length of each part of the first conductive channel in any other direction.

According to the foregoing display panel manufacturing method, when the first thin film transistor in the bent display area of the display panel is manufactured, the included angle between the direction of the first conductive channel of the first thin film transistor in the bent display area and the bending axis is set to be less than 90 degrees. Therefore, when the included angle between the direction of the first conductive channel and a strain direction of the first conductive channel is not 0 degrees, as compared with a case in which the direction of the first conductive channel is parallel to the strain direction of the first conductive channel, the strain on the first conductive channel along the direction of the first conductive channel decreases, a change of a carrier mobility in the first conductive channel decreases, a change of a turn-on current of the first thin film transistor decreases, a change of a drive current of the bent display area decreases, and a difference between display brightness of the bent display area and that of the non-bent display area decreases, thereby improving a display effect of the display panel.

In a possible design, the method further includes:

forming a gate medium layer on the patterned first metal layer;

forming an inter-layer insulation layer on the gate medium layer;

forming a first via hole and a second via hole, where the first via hole and the second via hole respectively expose the first source region and the first drain region; and forming a patterned source-drain metal layer, and performing bonding on a first source and a first drain, where the source-drain metal layer includes the first source and the first drain.

In a possible design, when bending of the substrate causes the first conductive channel to be subjected to a compressive strain, the included angle between the direction of the first conductive channel and the bending axis is 0 degrees to 5 degrees.

In a possible design, the included angle between the direction of the first conductive channel and the bending axis is 0 degrees.

In a possible design, when bending of the substrate causes the first conductive channel to be subjected to a tensile strain, the included angle between the direction of the first conductive channel and the bending axis is 65 degrees to 75 degrees.

5

Figure 6:
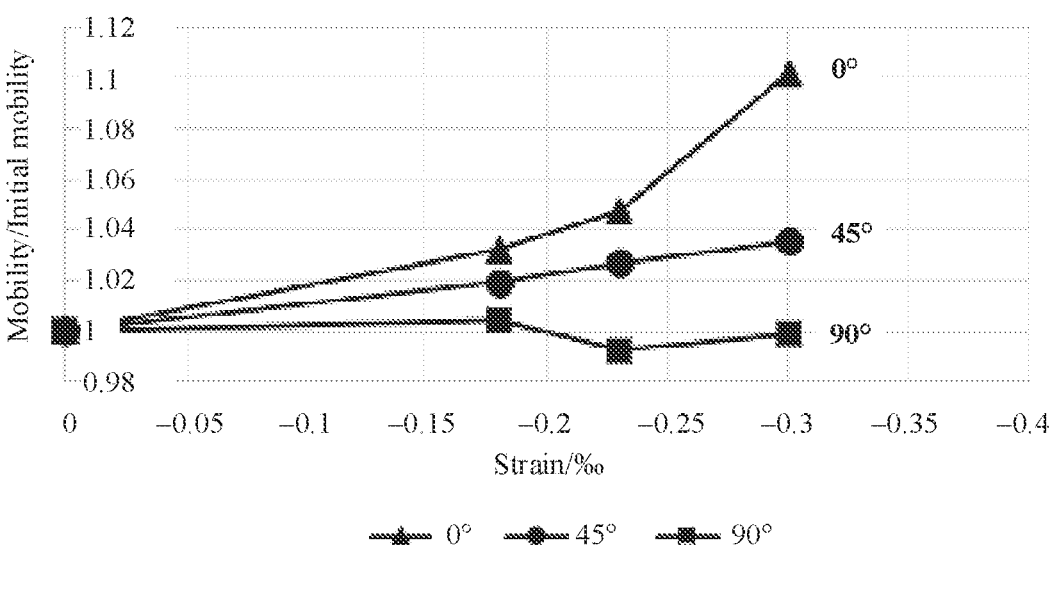
Figure 7:
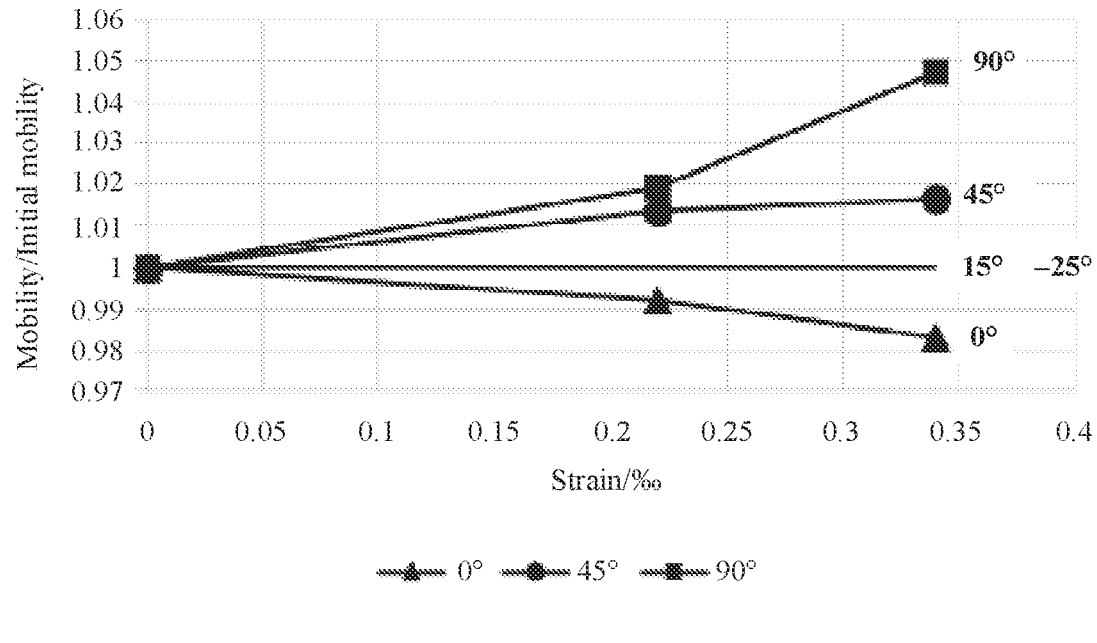
Figure 8:
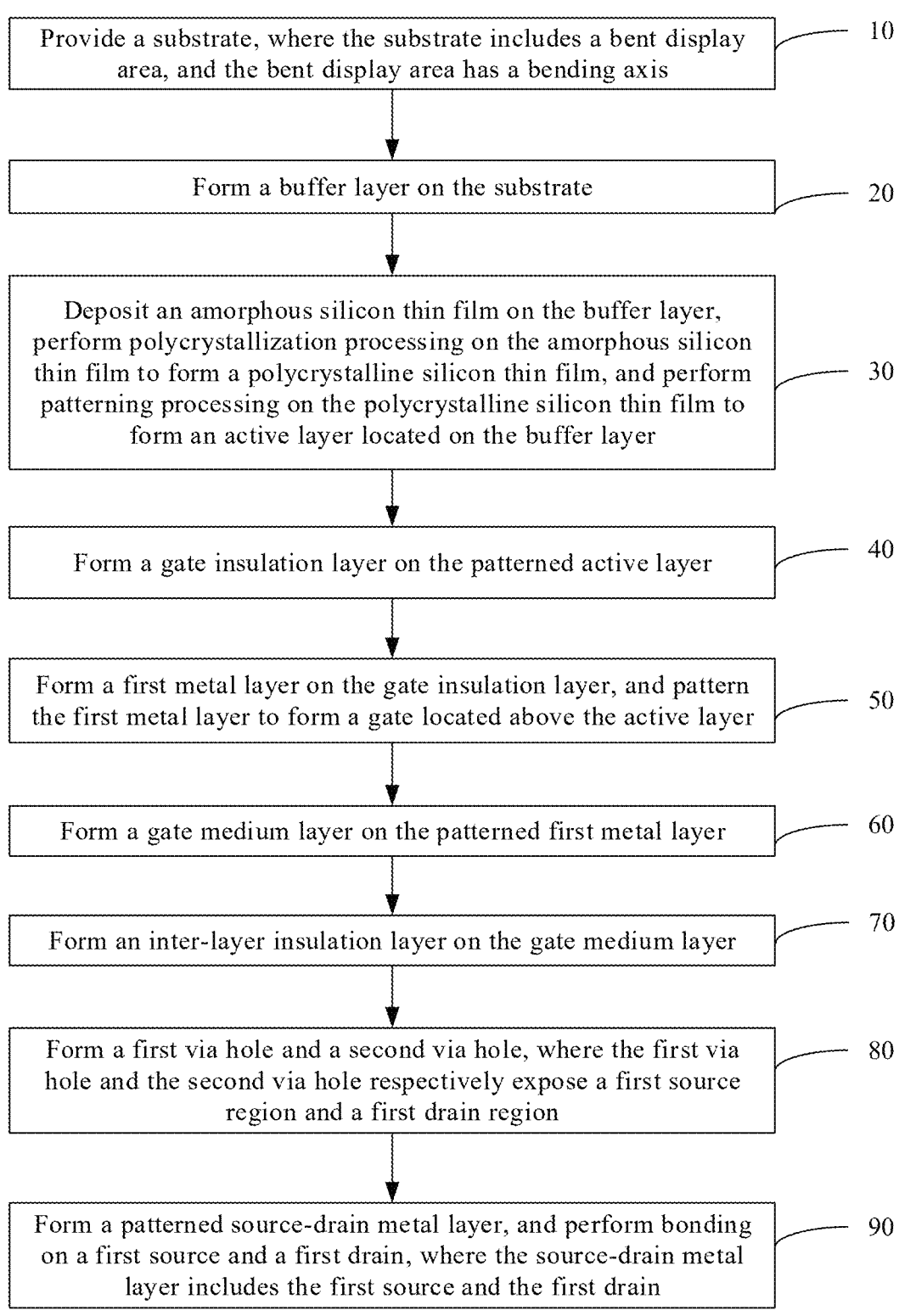
Figure 9:
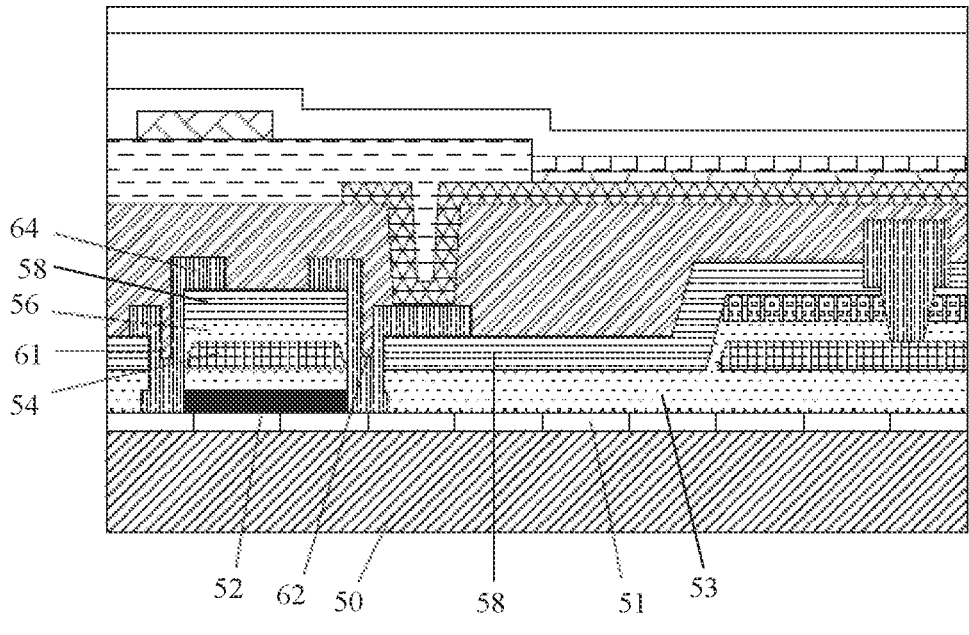

FIG. 6 is a line graph showing changing of a carrier mobility with a compressive strain in a first thin film transistor according to an embodiment of this application;

FIG. 7 is a line graph showing changing of a carrier mobility with a tensile strain in a first thin film transistor according to an embodiment of this application;

FIG. 8 is a flowchart of a display panel manufacturing method according to an embodiment of this application; and FIG. 9 is a sectional view of a display panel according to an embodiment of this application.

DESCRIPTION OF EMBODIMENTS

For ease of understanding of this application, the following describes this application more comprehensively with reference to related accompanying drawings. The accompanying drawings provide example embodiments of this application. However, this application may be implemented in many different forms, and is not limited to the embodiments described herein. On the contrary, an objective of providing these embodiments is to make the content disclosed in this application more thoroughly and comprehensively understood.

Unless otherwise defined, all technical and scientific terms used in this specification have same meanings as those usually understood by a person skilled in the art of this application. The terms used in the specification of this application are merely for the purpose of describing specific embodiments, and are not intended to limit this application.

Thin film transistors are classified into polycrystalline silicon (poly-Si, p-Si) TFTs and amorphous silicon (a-Si) TFTs. The difference between the two types of TFTs lies in their features. A molecular structure of a p-Si TFT is neatly and directionally arranged in a grain (Grain). Therefore, the p-Si TFT has an electron mobility 200-300 times higher than that of the a-Si TFT. The p-Si mainly falls into two types: high temperature polycrystalline silicon (high temperature p-Si, HTPS) and low temperature polycrystalline silicon (low temperature p-Si, LTPS).

The LTPS technology is a process that can be applied to a next-generation TFT display, and is mainly used to convert an a-Si thin film into a p-Si thin film by using an excimer laser annealing process, a metal-optimized crystallization process, or a solid phase crystallization process. The LTPS TFT display has a shorter response time and higher resolution, and therefore has a better image display quality. The LTPS technology is used to form a peripheral circuit of a display apparatus, so that a quantity of integrated circuits can be reduced, the peripheral of the display apparatus can be simplified, thereby implementing a narrow bezel technology.

A flexible display is a display that can be flexed, bent, folded, or rolled without obvious damage and is made of a thin and flexible substrate, which is different from a flat panel display. In recent years, with development of new material technologies, applying a flexible display to an electronic device has come true. The flexible display may be used in various application fields, for example, in e-paper, an e-book, a television, a computer, a palmtop computer, a vehicle-mounted display, a tablet computer, a smartphone, and a wearable device.

With an increasing quantity of flexible displays, active-matrix organic light-emitting diode (active-matrix organic light-emitting diode, AMOLED) display panels based on LTPS are widely used. However, in a bending process of the LTPS-based flexible display, there is a brightness difference between a bent display area and a non-bent display area. The applicant has found that, when an LTPS TFT is subjected to a compressive strain, a carrier mobility in the LTPS TFT increases (for example, 0.3% % compressive strain can cause the carrier mobility to increase by 10%), and a turn-on current of the LTPS TFT increases, and the increase in the turn-on current of the LTPS TFT causes an increase in a drive current of the bent display area, thereby causing an increase in image brightness. When the LTPS TFT is subject to tensile strain, the carrier mobility in the LTPS TFT decreases (0.3% % tensile strain can cause the carrier mobility to decrease by 2% to 5%), and the turn-on current of the LTPS TFT decreases, and the increase in the turn-on current of the LTPS TFT causes a decrease in the drive current of the bent display area, thereby causing a decrease in the image brightness. In addition, as a display time of the bent display area increases, a difference between the display brightness of the bent display area and the display brightness of the non-bent display area is greater.

Figure 1:
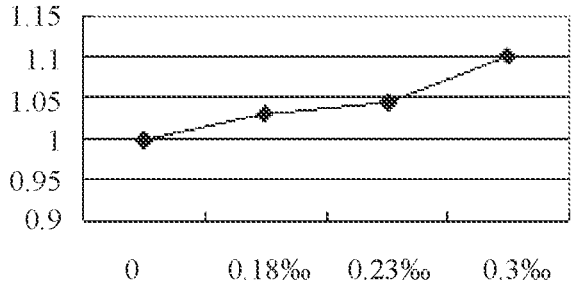
FIG. 1 is a line graph showing changing of a carrier mobility with a compressive strain in an existing thin film transistor.

A thin film transistor usually includes a source and a drain, and a conductive channel is included between the source and the drain. FIG. 1 is a line graph showing changing of a carrier mobility in the thin film transistor with a compressive strain on the thin film transistor when the thin film transistor is subjected to the compressive strain and a direction of the compressive strain is parallel to a direction of the conductive channel. It can be learned from FIG. 1 that, when the thin film transistor is subjected to the compressive strain and the direction of the compressive strain is parallel to the direction of the conductive channel, the carrier mobility in the thin film transistor increases with an increase in the compressive strain on the thin film transistor. A total length of each part of the conductive channel in the direction of the conductive channel is greater than a total length of each part of the conductive channel in any other direction.

Figure 2:
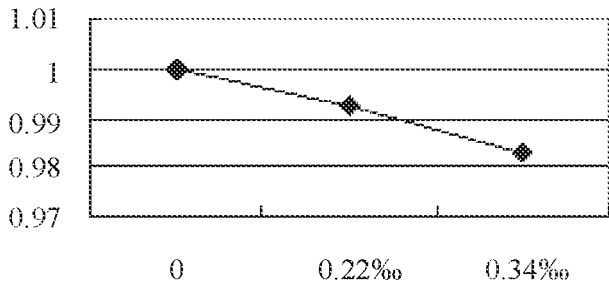
FIG. 2 is a line graph showing changing of a carrier mobility with a tensile strain in an existing thin film transistor.

FIG. 2 is a line graph showing changing of a carrier mobility in a thin film transistor with a tensile strain on the thin film transistor when the thin film transistor is subjected to the tensile strain and a direction of the tensile strain is parallel to a direction of a conductive channel. It can be learned from FIG. 2 that, when the thin film transistor is subjected to the tensile strain and the direction of the tensile strain is parallel to the direction of the conductive channel, the carrier mobility in the thin film transistor decreases as the tensile strain increases.

Figure 3:
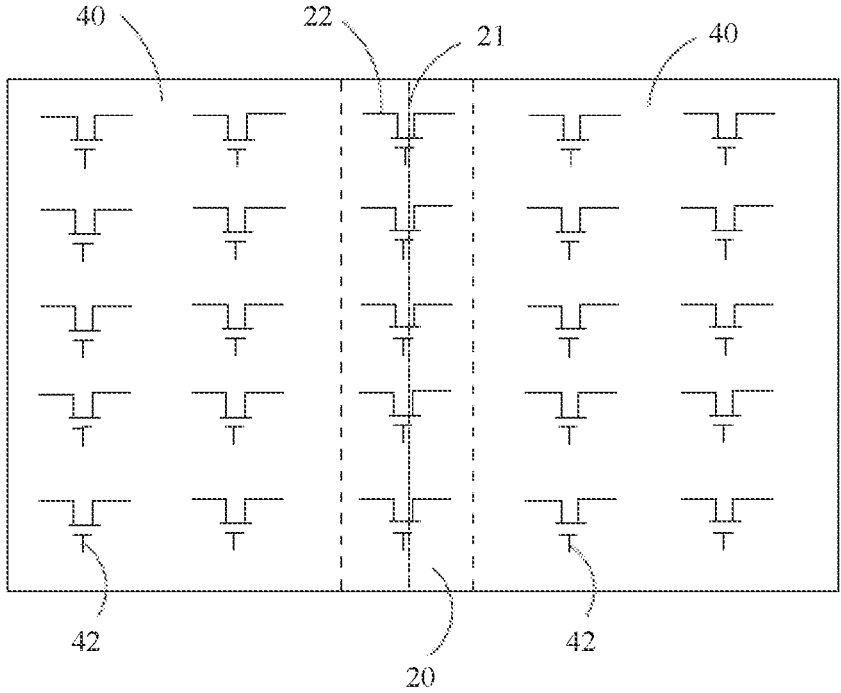
FIG. 3 is a schematic diagram of a structure of a display panel according to an embodiment of this application.
Figure 4:
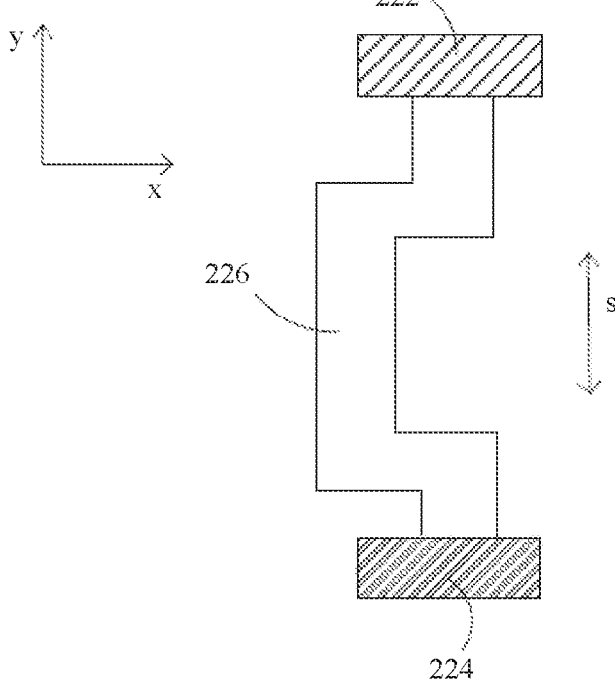
FIG. 4 is a schematic diagram of a first source, a first drain, and a first conductive channel according to an embodiment of this application.
Figure 5:
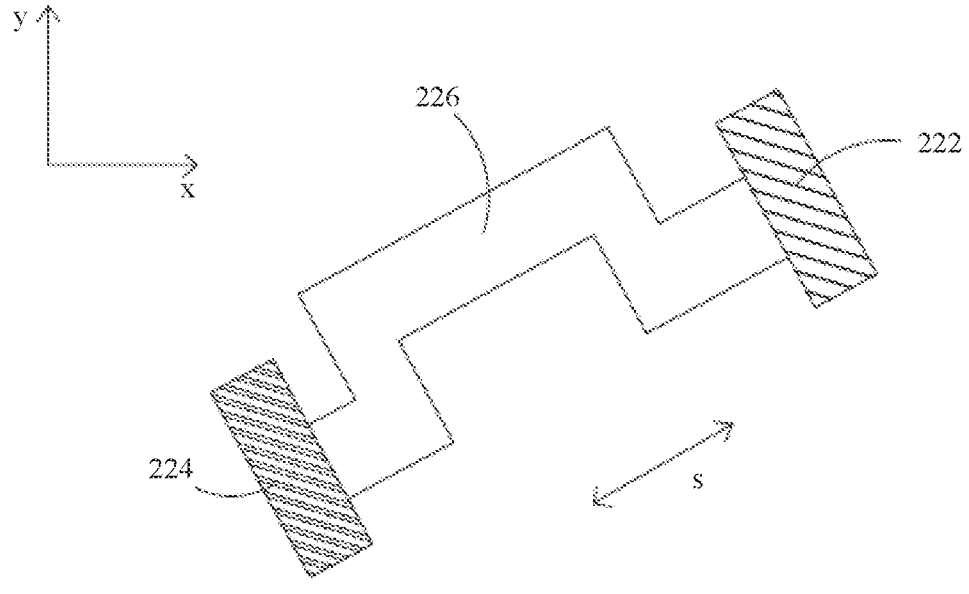
FIG. 5 is a schematic diagram of a first source, a first drain, and a first conductive channel according to another embodiment of this application.

Referring to FIG. 3 to FIG. 5, an embodiment of this application provides a display panel, including a bent display area 20, where the bent display area 20 has a bending axis 21. A plurality of first thin film transistors 22 are disposed in the bent display area 20. Each first thin film transistor 22 includes a first source 222 and a first drain 224, and a first conductive channel 226 is formed between the first source 222 and the first drain 224 of each first thin film transistor 22. An included angle between a direction s of the first conductive channel and the bending axis 21 is less than 90 degrees. A total length of each part of the first conductive channel 226 in the direction s of the first conductive channel is greater than a total length of each part of the first conductive channel 226 in any other direction.

For a rollable display panel, the rollable display panel has a length and a width. The rollable display panel can be rolled along the bending axis in a length direction, and the bending axis is perpendicular to the length direction of the rollable display panel. In this case, each area of the display panel in the length direction may be bent, and each area of the display panel is a bent display area 20. Alternatively, the rollable display panel can be rolled along the bending axis in a width direction, and the bending axis is perpendicular to the width direction of the rollable display panel. In this case, each area of the display panel in the width direction may be bent, and each area of the display panel is a bent display area 20.

For a foldable display panel, the bent display area 20 occupies only a part of the display panel, and the bent display area 20 has a length and a width. The foldable display panel can be folded along the bending axis in the length direction, and the bending axis is perpendicular to the length direction of the foldable display panel. Alternatively, the foldable display panel can be folded along the bending axis in the width direction, and the bending axis is perpendicular to the width direction of the foldable display panel.

It should be noted that, regardless of the rollable display panel or the foldable display panel, the bending axis of the display panel is determined.

The bent display area 20 is an area in which a stress and a strain are generated in each part of the structure in the display panel when the display panel is bent along the bending axis 21. A strain direction of each part of the structure in the display panel is perpendicular to the bending axis 21. Each part of the structure specifically means that the display panel includes a substrate, a thin film transistor, a pixel, and the like that are formed on the substrate. A projection of the first conductive channel 226 on the substrate may be curved or linear. Because the included angle between the direction s of the first conductive channel and the bending axis 21 is less than 90 degrees, the included angle between the direction s of the first conductive channel and the strain direction of the first conductive channel 226 is not 0 degrees, that is, the direction s of the first conductive channel and the strain direction of the first conductive channel 226 are not parallel to each other. In FIG. 4 and FIG. 5, a first direction x is a strain direction of the first thin film transistor 22, and a second direction y is parallel to the bending axis 21.

A mobility represents a moving speed of carriers in the first conductive channel 226 between the first source 222 and the first drain 224. When the first conductive channel 226 is subjected to a strain along the direction s of the first conductive channel, a length of the first conductive channel 226 in the direction s of the first conductive channel changes. When the direction s of the first conductive channel is parallel to the strain direction of the first thin film transistor 22, the first conductive channel 226 is subjected to a maximum strain along the direction s of the first conductive channel, and the first conductive channel 226 has a maximum length change in the direction s of the first conductive channel. When the first conductive channel 226 is subjected to a compressive strain along the direction s of the first conductive channel, the length of the first conductive channel 226 in the direction s of the first conductive channel is reduced; or when the first conductive channel 226 is subjected to a tensile strain along the direction s of the first conductive channel, the length of the first conductive channel 226 in the direction s of the first conductive channel is increased.

When the direction s of the first conductive channel of the first thin film transistor 22 is not parallel to the strain direction of the first thin film transistor 22, as compared with a case in which the direction s of the first conductive channel is parallel to the strain direction of the first thin film transistor 22, the strain on the first conductive channel 226 along the direction s of the first conductive channel decreases, a change of the length of the first conductive channel 226 in the direction s of the first conductive channel decreases, and a change of the carrier mobility in the first conductive channel 226 decreases.

The display panel may further include a non-bent display area, and display brightness of the non-bent display area is not affected by bending of the bent display area 20.

According to the display panel in this embodiment of this application, the included angle between the direction s of the first conductive channel of the first thin film transistor 22 in the bent display area 20 and the bending axis 21 is set to be less than 90 degrees. Therefore, when the included angle between the direction s of the first conductive channel and the strain direction of the first conductive channel 226 is not 0 degrees, as compared with a case in which the direction s of the first conductive channel is parallel to the strain direction of the first conductive channel 226, the strain on the first conductive channel 226 along the direction s of the first conductive channel decreases, a change of the carrier mobility in the first conductive channel 226 decreases, a change of a turn-on current of the first thin film transistor 22 decreases, a change of a drive current of the bent display area 20 decreases, and a difference between display brightness of the bent display area 20 and display brightness of the non-bent display area is reduced, thereby improving a display effect of the display panel.

In an embodiment, when bending of the display panel causes the first thin film transistor 22 in the bent display area 20 to be subjected to a compressive strain, the included angle between the direction s of the first conductive channel of the first thin film transistor 22 and the bending axis 21 is 0 degrees to 5 degrees. Preferably, when the included angle between the direction s of the first conductive channel of the first thin film transistor 22 and the bending axis 21 is 0 degrees, the compressive strain on the first conductive channel 226 is perpendicular to the direction s of the first conductive channel, and the length of the first conductive channel 226 in the direction s of the first conductive channel does not change with the compressive strain on the first conductive channel 226, a carrier mobility in the first conductive channel 226 does not change with the compressive strain on the first conductive channel 226. Therefore, the turn-on current of the first thin film transistor 22 does not change with the compressive strain on the first conductive channel 226, the drive current of the bent display area 20 is the same as a drive current of the non-bent display area, and display brightness of the bent display area 20 is the same as that of the non-bent display area.

It may be understood that, when the included angle between the direction s of the first conductive channel and the bending axis 21 is 0 degrees, the included angle between the direction s of the first conductive channel and the compressive strain on the first conductive channel 226 is 90 degrees. When the included angle between the direction s of the first conductive channel and the bending axis 21 is 45 degrees, the included angle between the direction s of the first conductive channel and the compressive strain on the first conductive channel 226 is 45 degrees. When the included angle between the direction s of the first conductive channel and the bending axis 21 is 90 degrees, the included angle between the direction s of the first conductive channel and the compressive strain on the first conductive channel 226 is 0 degrees.

FIG. 6 is a line graph showing changing of a carrier mobility in a first thin film transistor 22 with a compressive strain according to an embodiment of this application. Specifically, FIG. 6 is a line graph showing changing of the carrier mobility in the first thin film transistor 22 with the compressive strain when the first thin film transistor 22 is subjected to a compressive strain and included angles between a direction of the compressive strain and a direction s of a first conductive channel are respectively 0 degrees, 45 degrees, and 90 degrees. It can be learned from FIG. 6 that, when the included angle between the direction s of the first conductive channel and the compressive strain on the first conductive channel 226 is 0 degrees, the carrier mobility in the first conductive channel 226 increases with an increase in the compressive strain on the first conductive channel 226. When the included angle between the direction s of the first conductive channel and the compressive strain on the first conductive channel 226 is 45 degrees, the carrier mobility in the first conductive channel 226 increases with an increase in the compressive strain on the first conductive channel 226. When the compressive strain on the first conductive channel 226 changes the same, the included angle between the direction s of the first conductive channel and the compressive strain on the first conductive channel 226 is 0 degrees, and the change of the carrier mobility in the first conductive channel 226 is greater as compared with a case in which the included angle between the direction s of the first conductive channel and the compressive strain on the first conductive channel 226 is 45 degrees. When the included angle between the direction s of the first conductive channel and the compressive strain on the first conductive channel 226 is 90 degrees, the carrier mobility in the first conductive channel 226 basically does not change with the compressive strain on the first conductive channel 226.

In an embodiment, when bending of the display panel causes the first thin film transistor 22 in the bent display area 20 to be subjected to a tensile strain, the included angle between the direction s of the first conductive channel of the first thin film transistor 22 and the bending axis 21 is 65 degrees to 75 degrees. When bending of the display panel causes the first thin film transistor 22 in the bent display area 20 to be subjected to a tensile strain, the included angle between the direction s of the first conductive channel of the first thin film transistor 22 and the bending axis 21 is set to 65 degrees to 75 degrees, and the tensile strain on the first conductive channel 226 is mostly perpendicular to the direction s of the first conductive channel, the length of the first conductive channel 226 in the direction s of the first conductive channel changes slightly with the tensile strain on the first conductive channel 226, and the carrier mobility in the first conductive channel 226 changes slightly with the tensile strain on the first conductive channel 226. Therefore, the turn-on current of the first thin film transistor 22 changes slightly with the tensile strain on the first conductive channel 226, a difference between the drive current of the bent display area 20 and the drive current of the non-bent display area is relatively small, and a difference between the display brightness of the bent display area 20 and the display brightness of the non-bent display area is relatively small.

It may be understood that, when the included angle between the direction s of the first conductive channel and the bending axis 21 is 65 degrees to 75 degrees, the included angle between the direction s of the first conductive channel and the tensile strain on the first conductive channel 226 is 15 degrees to 25 degrees. When the included angle between the direction s of the first conductive channel and the bending axis 21 is 90 degrees, the included angle between the direction s of the first conductive channel and the tensile strain on the first conductive channel 226 is 0 degrees. When the included angle between the direction s of the first conductive channel and the bending axis 21 is 45 degrees, the included angle between the direction s of the first conductive channel and the tensile strain on the first conductive channel 226 is 45 degrees. When the included angle between the direction s of the first conductive channel and the bending axis 21 is 0 degrees, the included angle between the direction s of the first conductive channel and the tensile strain on the first conductive channel 226 is 90 degrees.

FIG. 7 is a line graph showing changing of a carrier mobility in a first thin film transistor 22 with a tensile strain according to an embodiment of this application. Specifically, FIG. 7 is a line graph showing changing of the carrier mobility in the first thin film transistor 22 with the tensile strain when the first thin film transistor 22 is subjected to the tensile strain and included angles between the direction of the tensile strain and the direction s of the first conductive channel are respectively 0 degrees, 15 degrees to 25 degrees, 45 degrees, and 90 degrees. It can be learned from FIG. 7 that, when the included angle between the direction s of the first conductive channel and the tensile strain on the first conductive channel 226 is 0 degrees, the carrier mobility in the first conductive channel 226 decreases with an increase in the tensile strain on the first conductive channel 226. When the included angle between the direction s of the first conductive channel and the tensile strain on the first conductive channel 226 is 45 degrees, the carrier mobility in the first conductive channel 226 increases with an increase in the tensile strain on the first conductive channel 226. When the included angle between the direction s of the first conductive channel and the tensile strain on the first conductive channel 226 is 90 degrees, the carrier mobility in the first conductive channel 226 increases with an increase in the tensile strain on the first conductive channel 226. When the included angle between the direction s of the first conductive channel and the tensile strain on the first conductive channel 226 is 15 degrees to 25 degrees, the carrier mobility in the first conductive channel 226 basically does not change with the tensile strain on the first conductive channel 226.

In an embodiment, a plurality of second thin film transistors are further disposed in the bent display area, each second thin film transistor includes a second source and a second drain, a second conductive channel is formed between the second source and the second drain of each second thin film transistor, and a direction of the second conductive channel is the same as the direction s of the first conductive channel; and a total length of each part of the second conductive channel in the direction of the second conductive channel is greater than a total length of each part of the second conductive channel in any other direction.

One first thin film transistor 22 may form a TFT drive circuit of a 2TIC structure with two second thin film transistors and one capacitor, or one first thin film transistor 22 may form a TFT drive circuit of a 6TIC structure with six second thin film transistors and one capacitor, or one first thin film transistor 22 may form a TFT drive circuit of a 7TIC structure with seven second thin film transistors and one capacitor, or one first thin film transistor 22 may form a TFT drive circuit of a 5T2C structure with five second thin film transistors and two capacitors, or the like. One TFT drive circuit is used to drive one subpixel to emit light. The second thin film transistor in the TFT drive circuit is used as a switching thin film transistor, and is configured to control whether a current enters the drive circuit. The first thin film transistor 22 is used as a driving thin film transistor, and is connected to a supply voltage to provide a drive current for a subpixel within a specific time period.

The direction of the second conductive channel of the second thin film transistor in the bent display area is set to be the same as the direction s of the first conductive channel, so that a manufacturing process of the thin film transistor of the display panel can be simplified, and costs can be reduced.

In another embodiment, the direction of the second conductive channel may alternatively be different from the direction s of the first conductive channel.

Referring to FIG. 1 again, in an embodiment, a plurality of third thin film transistors 42 are disposed in a non-bent display area 40. Each third thin film transistor 42 includes a third source and a third drain, and a third conductive channel is formed between the third source and the third drain of each third thin film transistor 42. A direction of the third conductive channel is different from a direction s of the first conductive channel, where a total length of each part of the third conductive channel in the direction of the third conductive channel is greater than a total length of each part of the third conductive channel in any other direction. The third thin film transistor 42 includes a switching thin film transistor and a driving thin film transistor.

In an embodiment, a plurality of third thin film transistors 42 are disposed in a non-bent display area 40. Each third thin film transistor 42 includes a third source and a third drain, and a third conductive channel is formed between the third source and the third drain of each third thin film transistor 42. A direction of the third conductive channel is the same as a direction s of the first conductive channel, where a total length of each part of the third conductive channel in the direction of the third conductive channel is greater than a total length of each part of the third conductive channel in any other direction. The third thin film transistor 42 includes a switching thin film transistor and a driving thin film transistor.

In this embodiment, the direction of the third conductive channel of the third thin film transistor 42 in the non-bent display area 40 is set to be the same as the direction s of the first conductive channel, so that a manufacturing process of the thin film transistor of the display panel can be simplified, and costs can be reduced.

The first thin film transistor 22, the second thin film transistor, and the third thin film transistor 42 are all polycrystalline silicon thin film transistors. Further, the first thin film transistor 22, the second thin film transistor, and the third thin film transistor 42 are all low temperature polycrystalline silicon thin film transistors. By using a low temperature polycrystalline silicon thin film transistor, the flexible display including the display panel may have advantages such as a high mobility, a high reaction speed, a high resolution, a high brightness, and a high opening rate.

An embodiment of this application further provides an electronic device. The electronic device includes a display, and the display includes the display panel according to any one of the foregoing embodiments. The electronic device may be an e-book, a television, a computer, a palmtop computer, a vehicle-mounted display, a tablet computer, a smartphone, a wearable device, or the like.

Referring to FIG. 8, an embodiment of this application further provides a display panel manufacturing method, which is specifically a manufacturing method of a first thin film transistor in a bent display area. The method includes the following steps.

Step S10: Provide a substrate 50, where the substrate includes a bent display area, and the bent display area has a bending axis. The substrate 50 may be a polymer plastic substrate, or may be made of another suitable material.

Also referring to FIG. 9, in step S20, a buffer layer 51 is formed on the substrate 50.

Specifically, the buffer layer 51 may be deposited by using a physical vapor deposition method, a chemical vapor deposition method, or a plasma-assisted chemical vapor deposition method. A material of the buffer layer 51 may be silicon oxide (SiOX), silicon nitride (SiNx), or a combination thereof. The buffer layer 51 may have a single-layer or multi-layer structure. When the buffer layer 51 has a single-layer structure, a material of the buffer layer 51 may be, for example, silicon oxide (SiOX) or silicon nitride (SiNx). When the buffer layer 51 has a structure including two or more layers, the buffer layer 51 may be a composite film layer of a silicon oxide layer and a silicon nitride layer.

Step S30: Deposit an amorphous silicon thin film on the buffer layer 51, perform polycrystallization processing on the amorphous silicon thin film to form a polycrystalline silicon thin film, and perform patterning processing on the polycrystalline silicon thin film to form an active layer 52 located on the buffer layer 51.

For example, the depositing amorphous silicon thin film on the buffer layer 51 may be: depositing a layer of amorphous silicon thin film on the buffer layer 51 by using a plasma enhanced chemical vapor deposition (Plasma Enhanced Chemical Vapor Deposition, PECVD for short) method, and performing dehydrogenation processing on the amorphous silicon thin film by using a high-temperature oven, so as to prevent a hydrogen explosion phenomenon in a crystallization process and reduce a defect state density inside the thin film after crystallization. After the dehydrogenation process is completed, a low temperature polycrystalline silicon process is performed, and crystallization processing is performed on the amorphous silicon thin film by using crystallization methods such as an excimer laser annealing (ELA) process, a metal-induced crystallization (MIC) process, and a solid phase crystallization (SPC) process, so as to form an active layer 52 on the buffer layer 51.

Alternatively, an amorphous silicon thin film may be deposited on the substrate on which the buffer layer 51 is formed. A reserved pattern is first formed in a predetermined area by using a composition process, and then polycrystallization processing is performed on the reserved pattern to form a channel region pattern. The composition process includes steps such as masking, exposure, development, etching, and photoresist stripping.

Step S40: Form a gate insulation layer 53 on the patterned active layer 52.

A material of the gate insulation layer 53 may include at least one of silicon oxide or silicon nitride.

Step S50: Form a first metal layer on the gate insulation layer 53, pattern the first metal layer, and form a gate 54 located above the active layer 52.

In a process of forming the gate 54, ion injection is performed on the active layer 52, so that the active layer 52 includes a first conductive channel, a first source region, and a first drain region, where the first conductive channel is formed between the first source region and the first drain region. An included angle between a direction of the first conductive channel and the bending axis is less than 90 degrees. A total length of each part of the first conductive channel in a direction of the first conductive channel is greater than a total length of each part of the first conductive channel in any other direction.

If the lightly doped area and the heavily doped area are not distinguished in the first source region and the first drain region, after the gate 54 is formed, ion injection may be performed on the active layer 52 by using the gate 54 as a barrier, so that the active layer 52 includes the first conductive channel, and the first source region and the first drain region that are located on two sides of the first conductive channel.

If the first source region and the first drain region include a lightly doped area and a heavily doped area, when the gate 54 is formed, a halftone mask may be used to expose the photoresist, where a part with completely reserved photoresist covers an area corresponding to the gate 54, a part with semi-reserved photoresist covers an area corresponding to a to-be-formed lightly doped area in a polycrystalline silicon thin film, a part without reserved photoresist covers an area corresponding to the to-be-formed heavily doped area in the polycrystalline silicon thin film. In this way, after the photoresist is developed, ion injection may be performed on the exposed polycrystalline silicon thin film first to form a heavily doped area; then a graying process is performed to remove the part with semi-reserved photoresist, and the exposed first metal layer is etched to form the gate 54; and then ion injection is performed on the exposed active layer 52 by using the gate 54 as a barrier, so that the active layer 52, except the heavily doped area and the first conductive channel corresponding to the gate 54, forms a lightly doped area.

A material of the gate 54 may be, for example, molybdenum (Mo), aluminum (Al)/molybdenum, or copper (Cu).

Step S60: Form a gate medium layer 56 on the patterned first metal layer.

A material of the gate medium layer 56 may be, for example, silicon nitride.

Step S70: Form an inter-layer insulation layer 58 on the gate medium layer 56.

A material of the inter-layer insulation layer 58 may be, for example, silicon nitride.

Step S80: Form a first via hole 61 and a second via hole 62, where the first via hole 61 and the second via hole 62 respectively expose the first source region and the first drain region.

The first via hole 61 and the second via hole 62 may be formed simultaneously or separately by using a wet etching process or a plasma dry etching process.

Step S90: Form a patterned source-drain metal layer 64, and perform bonding between a first source and a first drain, where the source-drain metal layer 64 includes the first source and the first drain.

A material of the source-drain metal layer 64 may be, for example, Mo, Al/Mo, or Cu.

The foregoing display panel manufacturing method is also applicable to manufacturing of the second thin film transistor in the bent display area and the third thin film transistor in the non-bent display area of the display panel, and each step of a manufacturing process of the second thin film transistor in the bent display area and the third thin film transistor in the non-bent display area may be synchronized with that of a corresponding manufacturing process of the first thin film transistor in the bent area. Details are not described herein again.

After the TFT of the display panel is manufactured, the display panel manufacturing method may further include:

sequentially forming a passivation layer and a planarization layer; forming an indium tin oxide semiconductor transparent conductive layer; forming a pixel definition layer, and defining a pattern; and performing vapor deposition packaging to form a display panel.

According to the display panel manufacturing method in this embodiment of this application, when the first thin film transistor in the bent display area of the display panel is manufactured, the included angle between the direction of the first conductive channel of the first thin film transistor in the bent display area and the bending axis is set to be less than 90 degrees. Therefore, when the included angle between the direction of the first conductive channel and a strain direction of the first conductive channel is not 0 degrees, as compared with a case in which the direction of the first conductive channel is parallel to the strain direction of the first conductive channel, the strain on the first conductive channel along the direction of the first conductive channel decreases, a change of a carrier mobility in the first conductive channel decreases, a change of a turn-on current of the first thin film transistor decreases, a change of a drive current of the bent display area decreases, and a difference between display brightness of the bent display area and that of the non-bent display area decreases, thereby improving a display effect of the display panel.

In an embodiment, when bending of the substrate causes the first conductive channel to be subjected to a compressive strain, the included angle between the direction of the first conductive channel and the bending axis is 0 degrees to 5 degrees. Preferably, when the included angle between the direction of the first conductive channel and the bending axis is 0 degrees, the compressive strain on the first conductive channel is perpendicular to the direction of the first conductive channel, the length of the first conductive channel in the direction of the first conductive channel does not change with the compressive strain on the first conductive channel, and the carrier mobility in the first conductive channel does not change with the compressive strain on the first conductive channel. The turn-on current of the first thin film transistor does not change with the compressive strain on the first conductive channel, a drive current of the bent display area is the same as that of the non-bent display area, and display brightness of the bent display area is the same as that of the non-bent display area.

In an embodiment, when bending of the substrate causes the first conductive channel to be subjected to a tensile strain, the included angle between the direction of the first conductive channel and the bending axis is 65 degrees to 75 degrees. When bending of the substrate causes the first conductive channel to be subjected to a tensile strain, the included angle between the direction of the first conductive channel and the bending axis is set to 65 degrees to 75 degrees, the tensile strain on the first conductive channel is mostly perpendicular to the direction of the first conductive channel, and the length of the first conductive channel in the direction of the first conductive channel changes slightly with the tensile strain on the first conductive channel, the carrier mobility in the first conductive channel changes slightly with the tensile strain on the first conductive channel. Therefore, the turn-on current of the first thin film transistor changes slightly with the tensile strain on the first conductive channel, a difference between the drive current of the bent display area and a drive current of the non-bent display area is relatively small, and a difference between the display brightness of the bent display area and the display brightness of the non-bent display area is relatively small.

The technical features of the foregoing embodiments may be combined randomly. For brevity of description, not all possible combinations of the technical features in the foregoing embodiments are described. However, provided no conflict occurs when the technical features are combined, it should be considered that the technical features fall within the scope of the disclosure of this specification.

The foregoing embodiment merely illustrates some implementations of the present invention, and the description thereof is relatively specific and detailed, but it should not be construed as a limitation on the patent scope of the present invention. It should be noted that a person of ordinary skill in the art may make some improvements and polishing without departing from the idea of the present invention, and the improvements and polishing shall fall within the protection scope of the present invention. Therefore, the protection scope of the present invention patent shall be subject to the following claims.

What is claimed is:

1. A display panel, comprising a bent display area and a non-bent display area, wherein:

the bent display area has a bending axis, a plurality of first thin film transistors are disposed in the bent display area, each first thin film transistor comprises a first source and a first drain, a first conductive channel is formed between the first source and the first drain of each first thin film transistor, and an included angle between a direction of the first conductive channel and the bending axis is less than 90 degrees;

a total length of each part of the first conductive channel in the direction of the first conductive channel is greater than a total length of each part of the first conductive channel in any other direction;

a plurality of third thin film transistors are disposed in the non-bent display area, each third thin film transistor comprises a third source and a third drain, and a third conductive channel is formed between the third source and the third drain of each third thin film transistor; and a total length of each part of the third conductive channel in a direction of the third conductive channel is greater than a total length of each part of the third conductive channel in any other direction.

2. The display panel according to claim 1, wherein when bending of the display panel causes the first thin film transistor to be subjected to a compressive strain, the included angle between the direction of the first conductive channel of the first thin film transistor and the bending axis is 0 degrees to 5 degrees.

3. The display panel according to claim 2, wherein the included angle between the direction of the first conductive channel of the first thin film transistor and the bending axis is 0 degrees.

4. The display panel according to claim 1, wherein when bending of the display panel causes the first thin film transistor to be subjected to a tensile strain, the included angle between the direction of the first conductive channel of the first thin film transistor and the bending axis is 65 degrees to 75 degrees.

5. The display panel according to claim 1, wherein:

a plurality of second thin film transistors are further disposed in the bent display area, each second thin film transistor comprises a second source and a second drain, a second conductive channel is formed between the second source and the second drain of each second thin film transistor, and a direction of the second conductive channel is the same as the direction of the first conductive channel; and a total length of each part of the second conductive channel in the direction of the second conductive channel is greater than a total length of each part of the second conductive channel in any other direction.

6. The display panel according to claim 5, wherein both the first thin film transistor and the second thin film transistor are low temperature polycrystalline silicon thin film transistors.

7. The display panel according to claim 1, wherein:

the direction of the third conductive channel is different from the direction of the first conductive channel.

8. The display panel according to claim 1, wherein:

the direction of the third conductive channel is the same as the direction of the first conductive channel.

9. The display panel according to claim 7, wherein the third thin film transistor is a low temperature polycrystalline silicon thin film transistor.

* * * * *